US010500680B2

(12) United States Patent
Tachibana et al.

(10) Patent No.: US 10,500,680 B2
(45) Date of Patent: Dec. 10, 2019

(54) SOLDER ALLOY, SOLDER BALL, AND SOLDER JOINT (71) Applicant: SENJU METAL INDUSTRY CO., LTD., Tokyo (JP)

(72) Inventors: Ken Tachibana, Tokyo (JP); Hikaru Nomura, Tokyo (JP); Yuki Iijima, Tokyo (JP); Takashi Saito, Tokyo (JP); Takahiro Yokoyama, Tokyo (JP); Shunsaku Yoshikawa, Tokyo (JP); Naoko Izumita, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 15/780,543

(22) PCT Filed: Sep. 12, 2017

(86) PCT No.: PCT/JP2017/032834
§ 371 (c)(1),
(2) Date: May 31, 2018

(87) PCT Pub. No.: WO2018/051973
PCT Pub. Date: Mar. 22, 2018

(65) Prior Publication Data
US 2018/0361519 A1  Dec. 20, 2018

(30) Foreign Application Priority Data

Sep. 13, 2016 (JP) .................. 2016-178879
Sep. 13, 2016 (JP) .................. 2016-178880

(51) Int. Cl.
C22C 13/00 (2006.01)
C22C 13/02 (2006.01)
(Continued)

(52) U.S. Cl.
CPC ........ B23K 35/262 (2013.01); B23K 35/0244 (2013.01); C22C 13/00 (2013.01);
(Continued)

(58) Field of Classification Search
None
See application file for complete search history.

(56) References Cited

U.S. PATENT DOCUMENTS

2003/0021718 A1  1/2003 Munekata et al.
2004/0062679 A1  4/2004 Munekata et al.
(Continued)

FOREIGN PATENT DOCUMENTS

CN  101224524 A  7/2008
CN  105665956 A  6/2016
(Continued)

OTHER PUBLICATIONS

Office Action dated Nov. 19, 2018 for the corresponding Chinese Patent Application No. 201780004176.6 (an English translation attached hereto).
(Continued)

Primary Examiner — Humera N Sheikh
Assistant Examiner — Xiaobei Wang
(74) Attorney, Agent, or Firm — Leason Ellis LLP (57) ABSTRACT A solder alloy has an alloy composition consisting of, in mass %: Bi: 0.1% or more and less than 2.0%, Cu: 0.1 to 1.0%, Ni: 0.01 to 0.20%, Ge: 0.006 to 0.09%, and Co: 0.003% or more and less than 0.05%, and optionally Fe: 0.005 to 0.015% and P: 0.1% or less, with the balance being Sn.

16 Claims, 3 Drawing Sheets (51) Int. Cl.
  *B23K 35/02* (2006.01)
  *B23K 35/26* (2006.01)
  *H05K 3/34* (2006.01)
(52) U.S. Cl.
  CPC ............ *C22C 13/02* (2013.01); *H05K 3/3457* (2013.01); *H05K 3/3463* (2013.01)

(56) References Cited

U.S. PATENT DOCUMENTS

| | | |
|---|---|---|
| 2008/0061117 A1 | 3/2008 | Munekata et al. |
| 2010/0297470 A1 | 11/2010 | Munekata et al. |
| 2011/0089224 A1 | 4/2011 | Ohnishi et al. |
| 2012/0175020 A1 | 1/2012 | Imamura et al. |
| 2014/0054766 A1 | 2/2014 | Hashino et al. |
| 2014/0134042 A1* | 5/2014 | Chen .................... B23K 35/262 420/561 |
| 2014/0328719 A1 | 11/2014 | Chen |
| 2015/0146394 A1 | 5/2015 | Terashima et al. |
| 2016/0368102 A1 | 12/2016 | Nishimura et al. |

FOREIGN PATENT DOCUMENTS

| | | | |
|---|---|---|---|
| EP | 1273384 | A1 | 1/2003 |
| EP | 2671667 | A1 | 5/2013 |
| JP | 2000-190090 | * | 7/2000 |
| JP | 2003-094195 | A | 4/2003 |
| JP | 2006-289434 | A | 10/2006 |
| JP | 2012-106280 | A | 6/2012 |
| JP | 2014-097532 | A | 5/2014 |
| JP | 2014-217888 | A | 11/2014 |
| JP | 2016-129907 | A | 7/2016 |
| TW | 592872 | | 6/2004 |
| WO | WO-2009/131114 | A | 10/2009 |
| WO | WO-2014/084242 | A | 6/2014 |
| WO | WO-2014/192521 | A | 12/2014 |
| WO | WO-2015/166945 | A | 11/2015 |

OTHER PUBLICATIONS

International Search Report and Written Opinion dated Dec. 12, 2017 for the corresponding PCT Patent Application No. PCT/JP2017/032834.
Office Action dated Apr. 10, 2018 for the corresponding Taiwanese Patent Application No. 106131142.
Decision of Rejection dated Apr. 28, 2019 for the corresponding Chinese Patent Application No. 201780004176.6.
European Partial Supplementary Search Report dated Jul. 2, 2019 for the corresponding European Patent Application No. 17850875.0.
Extended European Search Report dated Aug. 28, 2019 for the corresponding European Patent Application No. 17850875.0.

* cited by examiner

SOLDER ALLOY, SOLDER BALL, AND SOLDER JOINT

CROSS-REFERENCE TO RELATED PATENT APPLICATIONS

This application is a U.S. National Phase Application under 35 U.S.C. § 371 of International Patent Application No. PCT/JP2017/032834 filed on Sep. 12, 2017 and claims the benefit of Japanese Patent Applications No. 2016-178879, filed on Sep. 13, 2016, and No. 2016-178880, filed on Sep. 13, 2016, all of which are incorporated herein by reference in their entireties. The International Application was published in Japanese on Mar. 22, 2018 as International Publication No. WO/2018/051973 under PCT Article 21(2).

FIELD OF THE INVENTION

The present invention relates to a solder alloy through which a current can be caused to flow at a high current density, and to a solder ball and a solder joint.

BACKGROUND OF THE INVENTION

Electronic devices having solder joints, such as CPUs (central processing units), have recently come to be required to have smaller sizes and higher performances. This has resulted in a tendency that the current density per terminal of the semiconductor elements mounted on such electronic devices becomes higher. It is said that in the future, the current density will reach about $10^4$ to $10^5$ A/cm$^2$. An increase in current density causes electromigration in the solder joints. The progress of the electromigration may result in ruptures of the solder joints.

Electromigration (hereinafter often referred to as "EM") is the following phenomenon. First, some of atoms constituting the solder joint collide with electrons which are producing the current, and the momentum is transferred from the electrons to the atoms. The atoms which have increased in momentum move toward the anode side of the solder joint along the flow of the electrons. The movement of the atoms toward the anode side of the solder joint results in the formation of vacancies in a cathode-side portion of the solder joint. Such vacancies gradually spread to form voids. The formed voids grow to finally cause a rupture of the solder joint. Because of the recent increases in current density, EM is becoming a serious problem.

Meanwhile, Sn—Cu solder alloys and Sn—Ag—Cu solder alloys have been extensively used as conventional lead-free solder alloys. These solder alloys are prone to suffer EM because Sn, which is used therein as a main component, has a large number of net charges. There are cases where solder joints formed from these alloys rupture when a current is caused to flow therethrough at a high current density over a long period. Although there are several other factors in solder joint ruptures, various alloys are being investigated in order to inhibit solder joint ruptures.

Patent Document 1 discloses an Sn—Bi—Cu—Ni solder alloy, which contains Bi in an amount of 2 mass % or more so that the solder alloy has improved tensile strength and improved wetting properties to give solder joints inhibited from rupturing.

Patent Document 2 discloses an Sn—Cu—Ni—Bi—Ge solder alloy, which is formed by adding Ge to the solder alloy shown above in order to improve the wetting properties to enable the solder alloy to retain high bonding strength, without decreasing in bonding strength, even when aged after solder bonding and to have improved reliability.

Patent Document 3 discloses a solder alloy based on the same type of alloy as in Patent Document 2. In Patent Document 3, the content of Bi has been reduced to less than 1% in order to inhibit the solder alloy from decreasing in impact resistance. The solder alloy of Patent Document 3 contains both P and Ge to have improved wetting properties, thereby giving solder joints having excellent impact resistance.

PRIOR ART DOCUMENTS

Patent Documents

Patent Document 1: JP-A-2014-097532
Patent Document 2: WO 2015/166945 A1
Patent Document 3: WO 2009/131114 A1

Technical Problems

However, the solder alloy described in Patent document 1 has a drawback in that since Bi is contained therein in an amount of 2% or more, the solder alloy itself has so high strength that ruptures are prone to occur at the bonding interfaces. Mobile products and the like fall unavoidably when carried, and in the case where the falling results in an impact or the like on the bonded part, a rupture would occur at the bonding interface. Because of this, when bonded parts are examined through a strength test, a rupture at the bonding interface, i.e., a mode of rupture (hereinafter suitably referred to as "rupture M") at the bonding interface, must be avoided. In Patent Document 1, a rupture at the bonding interface is unavoidable.

The invention described in Patent Document 2 is intended to improve the bonding strength of an aged solder joint, but is not intended to inhibit the occurrence of EM. Even if an aged solder joint having improved reliability is obtainable, it is not considered that any means has been taken for inhibiting the movement of metal atoms which is causative of EM. Because of this, in the case where a high-density current is caused to flow through solder joints obtained using the solder alloy described in Patent Document 2, the occurrence of EM cannot be sufficiently inhibited even though the solder alloy shows improved wetting properties due to the addition of Ge.

Patent Document 2 discloses only one solder alloy composition which contains Co to attain grain refinement in an intermetallic-compound layer, as described above. It seems that the grain refinement in an intermetallic-compound layer disperses the stress imposed on the boundaries of the intermetallic compounds to inhibit cracking and improve the bonding strength of the aged solder joints. However, since EM occurs due to the movement of atoms in the solder alloy as described above, the grain refinement of an intermetallic-compound layer cannot sufficiently inhibit the occurrence of EM if atoms can easily move from other phases.

Furthermore, although Patent Document 2 discloses the feature of adding Co for the purpose of grain refinement of an intermetallic-compound layer, this "grain refinement of an intermetallic-compound layer" seems to intend to inhibit the growth of a layer of intermetallic compounds, e.g., $Cu_6Sn_5$, being formed at the bonding interface. However, even if the growth of the "intermetallic-compound layer" is inhibited, the movement of atoms in the solder alloy cannot be inhibited and the occurrence of EM cannot be inhibited.

As described above, the solder alloys described in Patent Documents 1 and 2 cannot be sufficiently inhibited from suffering EM although an improvement in wetting property and an improvement in after-aging bonding strength due to grain refinement of an intermetallic-compound layer may be expected. Further investigations are hence necessary for inhibiting the occurrence of EM which accompanies size reductions and performance advancement in electronic devices.

In addition, the solder alloy described in Patent Document 3 is intended to have improved impact resistance but is not intended to be inhibited from suffering EM. Patent Document 3 hence failed to take any means for inhibiting the occurrence of EM, like Patent Document 2. Mere inclusion of P and Ge cannot sufficiently inhibit the occurrence of EM.

As shown above, the solder alloys described in Patent Documents 1 to 3 may bring about improvements in high-temperature bonding strength and impact resistance due to the improved wetting properties. However, these solder alloys necessitate further investigations for inhibiting the occurrence of EM which accompanies size reductions and performance advancement in electronic devices.

An object of the present invention is to provide a solder alloy which has excellent wetting properties for preventing soldering failures, is inhibited from suffering ruptures at the bonding interface, gives solder joints with high bonding strength after soldering, and is inhibited from suffering EM, and which can hence attain both reliability during bonding and long-term reliability after the bonding.

SUMMARY OF THE INVENTION

Solution to Problems

The present inventors diligently made investigations in order to enable an Sn—Bi—Cu—Ni—Ge solder alloy to have high wetting properties and high bonding strength and to be inhibited from suffering EM.

The present inventors first optimized the contents of Cu and Ni in order to improve the wetting properties and bonding strength.

The present inventors directed attention to the fact that it is necessary to inhibit the movement of Sn for inhibiting the occurrence of EM. The present inventors conceived of the following ideas: (1) it is necessary that for inhibiting the movement of Sn, a sufficient strain should be given to the Sn matrix; and (2) grain refinement of intermetallic compounds only is insufficient and grain refinement of the whole solder alloy structure is necessary for inhibiting the movement of Sn.

In order to embody the idea (1) shown above, the present inventors first optimized the content of Bi which dissolve in solid in Sn. It is, however, noted that although the content of Bi is controlled to give a strain to the Sn matrix, Cu and Ni also form intermetallic compounds with Sn to give a slight strain to the Sn matrix. Merely controlling the content of Bi is hence insufficient for controlling the strain of the Sn matrix, and cannot exhibit a sufficient EM-inhibiting effect. The present inventors then directed attention to Ge, which improves wetting properties, to further made investigations.

As a result, it was found that the addition of Ge enhances the strain of the Sn matrix due to the addition of Bi and that by highly accurately controlling the ratio between Sn content and Ge content, a strain which interferes with the movement of Sn is caused in the Sn matrix, making it possible to inhibit the occurrence of EM. It was thus found that, in Sn—Bi—Cu—Ni—Ge solder alloys, the balance between Ge content and Sn content is crucially important for producing an EM-inhibiting effect. It was also found that in the case where the ratio between the product of Ge content and Bi content (balance between Ge and Bi), Ge and Bi being EM-inhibiting elements, and the product of Cu content and Ni content (balance between Cu and Ni), Cu and Ni being bonding-strength-improving elements, is within a given range, then this solder alloy shows high wetting properties and high bonding strength while retaining a high EM-inhibiting effect. Namely, the present inventors have found that a combination of components constituting a solder alloy and the contents thereof, as a whole, have those technical significances in determining the properties of the solder alloy.

It has further become clear that in the case where such a solder alloy has an improper balance between Ge content and the contents of Sn, Cu, and Ni and contains Ge in excess, this solder alloy may have impaired wetting properties.

In addition, it has been found that in the case where the findings shown above are all satisfied, this solder alloy is inhibited from suffering ruptures at the bonding interface, which are fatal in soldering.

Next, in order to embody the idea (2) shown above, the present inventors optimized the contents of Bi and Ge which dissolve in solid in Sn, thereby giving a strain to the Sn matrix, and then incorporated Co in an amount within a given range. In this case, it has unexpectedly been found that grain refinement occurred not only in intermetallic compounds but also in the Sn phase which is the main phase, and the movement of metal atoms is sufficiently inhibited, thereby sufficiently inhibiting the occurrence of EM.

Moreover, it has been found that in the case where the findings shown above are all satisfied, this solder alloy is inhibited from suffering ruptures at the bonding interface, which are fatal in soldering.

It has been found that a preferred embodiment contains Fe in a given amount and that the addition of Fe can modify the properties of electrode/solder bonding interfaces to inhibit the occurrence of Kirkendall voids.

It has also been found that another preferred embodiment contains P in a given amount and that the addition of P further improves the wetting properties to improve the bonding strength.

The present invention achieved based on these findings is as follows.

(1) A solder alloy having an alloy composition consisting of, in mass %: Bi: 0.1% or more and less than 2.0%, Cu: 0.1 to 1.0%, Ni: 0.01 to 0.20%, Ge: 0.006 to 0.09%, and Co: 0.003% or more and less than 0.05%, with the balance being Sn.

(2) The solder alloy according to the above (1), wherein the alloy composition further comprises, in mass %, Fe: 0.005 to 0.015%.

(3) The solder alloy according to the above (1) or (2), wherein the alloy composition satisfies the following relation (1) and relation (2):

$$72 \times 10^{-6} \leq Ge/Sn \leq 920 \times 10^{-6} \qquad (1)$$

$$0.027 \leq (Bi \times Ge)/(Cu \times Ni) \leq 2.4 \qquad (2)$$

wherein in the relation (1) and relation (2), Bi, Ge, Cu, Ni and Sn each represents the content (mass %) in the solder alloy.

(4) A solder alloy having an alloy composition consisting of, in mass %: Bi: 0.1% or more and less than 2.0%, Cu: 0.1 to 1.0%, Ni: 0.01 to 0.20%, and Ge: 0.006 to 0.09%, with the balance being Sn, wherein the alloy composition satisfies the following relation (1) and relation (2):

$$72\times10^{-6} \leq Ge/Sn \leq 920\times10^{-6} \quad (1)$$

$$0.027 \leq (Bi\times Ge)/(Cu\times Ni) \leq 2.4 \quad (2)$$

wherein in the relation (1) and relation (2), Bi, Ge, Cu, Ni and Sn each represents the content (mass %) in the solder alloy.

(5) The solder alloy according to any one of the above (1) to (4), wherein the alloy composition further comprises, in mass %, P: 0.1% or less.

(6) The solder alloy according to any one of the above (1) to (5), which is for use in an electronic device including a joint through which a current is caused to flow at a current density of 5 kA/cm² to 100 kA/cm².

(7) A solder ball consisting of the solder alloy according to any one of the above (1) to (6).

(8) A solder joint comprising the solder alloy according to any one of the above (1) to (6).

DETAILED DESCRIPTION OF THE INVENTION

The present invention is described below in more detail. In this description, each "%" used for showing a solder alloy composition is "mass %" unless otherwise indicated.

1. Alloy Composition (1) Bi: 0.1% or More and Less than 2.0%

Bi is an element necessary for inhibiting the occurrence of EM. Bi dissolves in solid in Sn, and is hence capable of giving a strain to the Sn matrix to inhibit the movement of Sn. In the case where the content of Bi is less than 0.1%, the strain amount of the Sn matrix is too small to sufficiently inhibit the occurrence of EM. Consequently, as the lower limit of the content of Bi, it is 0.1% or more, preferably 0.2% or more, more preferably 0.3% or more, even more preferably 0.6% or more, especially preferably 1.0% or more. Meanwhile, in the case where the content of Bi is 2.0% or more, the solder alloy is too hard due to the strength enhancement by the Bi and this may be prone to cause a bonding-interface rupture. Consequently, as the upper limit of the content of Bi, it is less than 2.0%, preferably 1.9% or less, more preferably 1.8% or less, even more preferably 1.7% or less.

(2) Cu: 0.1 to 1.0%

Cu is an element necessary for improving the bonding strength of solder joints. In the case where the content of Cu is less than 0.1%, a sufficient improvement in bonding strength is not attained. Consequently, as the lower limit of the content of Cu, it is 0.1% or more, preferably 0.3% or more, more preferably 0.5% or more. Meanwhile, in the case where the content of Cu exceeds 1.0%, the solder alloy has impaired wetting properties. In addition, the impaired wetting properties may result in a decrease in bonding area and hence result in an increase in current density, rendering EM prone to occur. Consequently, as the upper limit of the content of Cu, it is 1.0% or less, preferably 0.9% or less, more preferably 0.8% or less.

(3) Ni: 0.01 to 0.20%

Ni, like Cu, is an element necessary for improving the bonding strength of solder joints. In the case where the content of Ni is less than 0.01%, a sufficient improvement in bonding strength is not attained. Consequently, as the lower limit of the content of Ni, it is 0.01% or more, preferably 0.02% or more, more preferably 0.03% or more. Meanwhile, in the case where the content of Ni exceeds 0.20%, the alloy has impaired wetting properties, and this may render EM prone to occur as in the case of Cu. Consequently, as the upper limit of the content of Ni, it is 0.20% or less, preferably 0.15% or less, more preferably 0.10% or less.

(4) Ge: 0.006 to 0.09%

Ge is an element necessary for improving the wetting properties of the solder alloy and inhibiting the occurrence of EM. Ge enhances the strain of the Sn matrix caused by the Bi, thereby inhibiting the movement of Sn to inhibit the occurrence of EM. In the case where the content of Ge is less than 0.006%, these effects are not sufficiently exhibited. As the lower limit of the content of Ge, it is 0.006% or more, preferably 0.007% or more, more preferably 0.008% or more. Meanwhile, in the case where the content of Ge exceeds 0.09%, the wetting properties become worse. The impaired wetting properties may result in poor bonding strength and further result in the occurrence of the rupture at the bonding interface. As the upper limit of the content of Ge, it is 0.09% or less, preferably 0.05% or less, more preferably 0.03% or less, even more preferably 0.02% or less, especially preferably 0.01% or less.

(5) Co: 0.003% or More and Less than 0.05%

Co contributes to grain refinement of the solder alloy structure, and is an element necessary for inhibiting the occurrence of EM. Co forms solidification nuclei during the solidification of the solder alloy to allow an Sn phase to precipitate therearound. Because a large number of solidification nuclei of Co are formed in the solder alloy during the solidification, the growth of the Sn phase precipitated around the solidification nuclei interferes with itself, resulting in grain refinement of the whole structure. The grain refinement of the whole structure inhibits the movement of Sn during current application, and as a result, the occurrence of EM is inhibited.

In the case where the content of Co is less than 0.003%, such an effect is not sufficiently exhibited. As the lower limit of the content of Co, it is 0.003% or more, more preferably 0.01% or more. Meanwhile, in the case where the content of Co is 0.05% or more, the solder alloy may have impaired wetting properties and poor bonding strength. As the upper limit of the content of Co, it is less than 0.05%, preferably 0.047% or less, more preferably 0.03% or less, even more preferably 0.02% or less.

(6) Fe: 0.005 to 0.015%

Fe is an optional element which can modify electrode/solder bonding interfaces to inhibit void formation especially at high temperatures and improve the bonding strength. More specifically, Fe can inhibit mutual diffusion between Cu, which is frequently used as an electrode material, and the Sn to inhibit the growth of intermetallic compound Cu₃Sn, thereby inhibiting the formation of Kirkendall voids. Fe can hence improve the bonding strength.

As the lower limit of the content of Fe, it is 0.005% or more, preferably 0.006% or more, more preferably 0.007%. As the upper limit of the content of Fe, it is 0.015% or less, preferably 0.014% or less, more preferably 0.013% or less, especially preferably 0.010% or less.

(7) Relation (1)

The solder alloy of the present invention, when containing no Co, must satisfy the following relation (1) even though the solder alloy satisfies the ranges shown under (1) to (4) above. In the case where the solder alloy in the present invention contains Co, this solder alloy desirably satisfies the following relation (1).

$$72 \times 10^{-6} \leq Ge/Sn \leq 920 \times 10^{-6} \quad (1)$$

In the relation (1), Ge and Sn each represents the content (mass %) in the solder alloy.

The relation (1) indicates the ratio of Ge content to Sn content. In the present invention, the movement of Sn is inhibited by regulating the content of Ge to the range shown above with respect to the total mass of the solder alloy and by highly accurately regulating the content of Ge with respect to the content of Sn. Thus, an EM-inhibiting effect can be exhibited. It is presumed that in the case where an Sn—Bi—Cu—Ni—Ge solder alloy satisfies the relation (1), the strain of the Sn matrix due to the addition of Bi occurs along a direction perpendicular to the direction in which electrons flow, and hence, the Sn can be prevented from moving along the flow of the electrons.

Consequently, even in the case of an alloy composition in which the contents of Cu, Ni, Bi, and Ge are all within the ranges shown under (1) to (4) above, the strain which is to occur in the Sn matrix cannot be controlled, if Ge/Sn is outside the range of $72 \times 10^{-6}$ to $920 \times 10^{-6}$ even slightly. The relation (1) is hence crucially important for inhibiting the occurrence of EM in Sn—Bi—Cu—Ni—Ge solder alloys.

As the lower limit of the relation (1), it is preferably $81 \times 10^{-6}$ or more, more preferably $90 \times 10^{-6}$ or more, especially preferably $101 \times 10^{-6}$ or more, from the standpoint of enhancing the strain of the Sn matrix. As the upper limit of the relation (1), it is preferably $917 \times 10^{-6}$ or less, more preferably $300 \times 10^{-6}$ or less, especially preferably $103 \times 10^{-6}$ or less, from the standpoint of inhibiting the wetting properties from becoming poor.

(8) Relation (2)

The solder alloy of the present invention, when containing no Co, must satisfy the relation (2) even though the solder alloy satisfies the ranges shown under (1) to (4) above. In the case where the solder alloy in the present invention contains Co, this solder alloy desirably satisfies the following relation (2).

$$0.027 \leq (Bi \times Ge)/(Cu \times Ni) \leq 2.4 \quad (2)$$

In the relation (2), Bi, Ge, Cu, and Ni each represents the content (mass %) in the solder alloy.

The relation (2) indicates the ratio of the product of Ge content and Bi content to the product of Cu content and Ni content, Ge and Bi being EM-inhibiting elements, and Cu and Ni being bonding-strength-improving elements. In the relation (2), the product of Ge content and Bi content represents the balance between Ge content and Bi content in the solder alloy. The product of Cu content and Ni content represents the balance between Cu content and Ni content in the solder alloy.

The reason why the effects of the present invention can be exhibited when the solder alloy in the present invention satisfies the relation (2) is unclear, but is presumed to be as follows.

The solder alloy in the present invention not only has excellent wetting properties and gives, after soldering, solder joints which have high bonding strength and can be in proper rupture mode, but also can be inhibited from suffering the occurrence of EM. Among the constituent elements of the solder alloy in the present invention, Cu and Ni are elements which contribute to an improvement in bonding strength, while Bi and Ge are elements which seem to inhibit the occurrence of EM.

In the case where the solder alloy contains Cu and Ni in amounts equal to or higher than the given amounts and hence has impaired wetting properties, the area of bonding to electrodes decreases to increase the current density, undesirably resulting in the occurrence of EM. Hence, by controlling the contents of Cu and Ni, the occurrence of EM can be indirectly inhibited. Meanwhile, Bi and Ge serve to give a strain to the Sn matrix to inhibit the movement of Sn, and can hence directly inhibit the occurrence of EM. However, excessive addition of Ge impairs the wetting properties, and excessive addition of Bi renders the rupture at the bonding interface more prone to occur.

As described above, the element group of Cu and Ni and the element group of Bi and Ge differ from each other in behavior in the solder alloy in the present invention. In order for an Sn—Bi—Cu—Ni—Ge solder alloy to simultaneously satisfy all of wetting properties, bonding strength of solder joints, inhibition of the occurrence of EM, and proper rupture mode, the solder alloy as a whole must be one in which the balance between Cu and Ni and the balance between Bi and Ge have been highly accurately regulated so as to satisfy the relation (2), like the solder alloy of the present invention.

As the lower limit of the relation (2), it is preferably 0.067 or more, more preferably 0.08 or more, even more preferably 0.2 or more, especially preferably 0.28 or more, from the standpoint of inhibiting the wetting properties or bonding strength from being impaired by a decrease in the relative amount of Cu and Ni. As the upper limit of the relation (2), it is preferably 2.0 or less, more preferably 1.333 or less, even more preferably 0.7 or less, especially preferably 0.507 or less, from the standpoints of inhibiting the wetting properties from deteriorating and of inhibiting the bonding strength from being reduced by embrittlement of the solder alloy.

As described above, the solder alloy in the present invention has excellent wetting properties and high bonding strength, be sufficiently inhibited from suffering the occurrence of EM, and be in proper rupture mode, by configuring the solder alloy so that the contents of the essential elements are within the ranges shown above and that both the relation (1) and the relation (2) are satisfied.

In the present invention, in the case where the alloy composition containing Co satisfies the relation (1) and the relation (2), a sufficient strain is given to the Sn matrix and grain refinement of the whole structure is rendered possible. The occurrence of EM can hence be sufficiently inhibited.

(9) P: 0.1% or Less

P is an optional element which can inhibit Sn from oxidizing and improve the wetting properties. So long as the content of P does not exceed 0.1%, P does not inhibit the surface flowability of the solder alloy. The content of P is 0.1% or less, preferably 0.01% or less, more preferably 0.008% or less. Meanwhile, as the lower limit of the content of P, it is preferably 0.001% or more, from the standpoint of exhibiting those effects.

The balance of the solder alloy in the present invention is Sn. The solder alloy may contain unavoidable impurities besides the elements described above. Even when the solder alloy contains unavoidable impurities, this inclusion does not affect the above effects. Even in the case where elements other than those to be contained in the present invention are contained as unavoidable impurities, the inclusion thereof does not affect the above effects, as will be described later.

2. Solder Joint

The solder joint according to the present invention is suitable for use in connecting an IC chip to a substrate therefor (interposer) in a semiconductor package or in connecting a semiconductor package to a printed wiring board. The term "solder joint" herein means a connecting part of an electrode.

3. Applications and Others

The solder alloy in the present invention is preferably used in electronic devices including a joint through which a current is caused to flow at a current density of 5 kA/cm² to 100 kA/cm². So long as the current density is within that range, the solder alloy in the present invention can be sufficiently inhibited from suffering EM. The current density is more preferably 10 kA/cm² to 100 kA/cm².

The solder alloy in the present invention can be used in the form of a preform, wire, solder paste, solder balls, or the like, and is preferably used as solder balls. In the case of use as solder balls, the diameter thereof is preferably in the range of 1 to 1,000 μm.

For producing the solder alloy in the present invention, an ordinary process may be used.

For using the solder alloy in the present invention to conduct bonding, a reflow method may, for example, be used in an ordinary way. In the case of performing flow soldering, the temperature at which the solder alloy is heated for melting may be a temperature higher by about 20° C. than the liquidus temperature. In the case of using the solder alloy in the present invention to conduct bonding, it is preferable that cooling rate during solidification should be taken into account, from the standpoint of grain refinement of the structure. For example, the solder joint is cooled at a cooling rate of 2 to 3° C./s or more. Other bonding conditions can be suitably regulated in accordance with the alloy composition of the solder alloy.

The solder alloy in the present invention can be produced as a low-α-ray alloy by using low-α-ray materials as raw materials therefor. Such a low-α-ray alloy, when used for forming solder bumps around memories, is effective in diminishing software errors.

Examples

Solder alloys respectively consisting of the alloy compositions shown in Tables 1 and 2 were used to form solder joints. The solder joints formed were evaluated for bonding strength by conducting a shear strength test, examination of rupture M, and EM test. The solder alloys were evaluated also for wetting property. The evaluation methods used are as follows.

Shear Strength

Soldering was conducted as follows: the solder alloys shown in Tables 1 and 2 were each bonded to OSP-treated Cu electrodes (hereinafter referred to simply as "Cu electrodes") of a PCB having a substrate thickness of 1.2 mm and an electrode size of 0.24 mm in diameter. The soldering was conducted in the following manner: solder balls having a diameter of 0.3 mm were produced beforehand from each solder alloy; a water-soluble flux (WF-6400, manufactured by Senju Metal Industry Co., Ltd.) was applied to the substrate, and the balls were then placed thereon; and thereafter, soldering was performed by a reflow method using a reflow profile employing a peak temperature of 245° C. and a cooling rate of 2° C./s; and then, specimens having solder bumps formed thereon were obtained.

These specimens were each examined for shear strength (N) with a shear strength tester (SERIES 4000HS, manufactured by Dage Ltd.) under the conditions of 1,000 mm/sec. The specimens which had a shear strength in bonding to the Cu electrode of 3.5 N or more were rated as good and indicated by "○", while those which had a shear strength less than 3.5 N were rated as poor and indicated by "x".

Rupture M

The rupture surfaces after the shear test were examined with a stereomicroscope. In the case where the solder bump was ruptured at the bonding interface, the rupture M was indicated by "x" (NG). In the case where the solder bump was ruptured in the other portion, the rupture M was indicated by "○" (OK).

Wetting Property Test

Using solder balls having a diameter of 0.3 mm, like the samples used in the shear strength test, a wetting and spreading test was performed by the following procedures "1." and "2.". The substrate material used was a glass-epoxy substrate (FR-4) having a thickness of 1.2 mm.

1. The substrate on which a slit-shaped Cu electrode of 0.24 mm×16 mm had been formed was used, and flux WF-6400, manufactured by Senju Metal Industry Co., Ltd., was printed thereon to form flux dots having a diameter of 0.24 mm and a thickness of 0.1 mm. The solder balls were placed thereon to conduct reflow under the conditions of 40-second holding in a temperature range of 220° C. or more and a peak temperature of 245° C.

2. Using a stereomicroscope, the area of the electrode surface wetted by the spread solder ball was measured. The case where the area of the wetted surface was 0.75 mm² or more was rated as good ("○"), while the case where the area of the wetted surface was less than 0.75 mm² was rated as poor ("x").

EM Test

Solder balls having the compositions shown in Table 1 and having a diameter of 0.3 mm, like the samples used in the shear strength test, were used as EM test samples. The solder balls were each subjected to reflow soldering, using the water-soluble flux, on a package substrate having a size of 13 mm×13 mm and having a Cu electrode with a diameter of 0.24 mm, thereby producing packages. Thereafter, a solder paste was printed on a glass-epoxy substrate (FR-4) having a size of 30 mm×120 mm and a thickness of 1.5 mm, and each package produced above was placed thereon. This assemblage was subjected to reflow under the conditions of 40-second holding in a temperature range of 220° C. or more and a peak temperature of 245° C. Thus, samples were produced.

An EM test was conducted in the following manner. Each sample produced above was connected to a compact variable-switching power source (PAK35-10A, manufactured by Kikusui Electronics Corp.), and a current was caused to flow therethrough at a current density of 12 kA/cm² in a silicone oil bath kept at 150° C. During the current application, the electrical resistance of the sample was continuously measured, and at the time when the electrical resistance had increased by 20% from the initial resistance value, the test was terminated. The case where the period to the termination of the test was 200 hours or more was rated as good ("○"), while the case where the time period was less than 200 hours was rated as poor ("x").

The results of the evaluation are shown in Tables 1 and 2.

Figure 1:
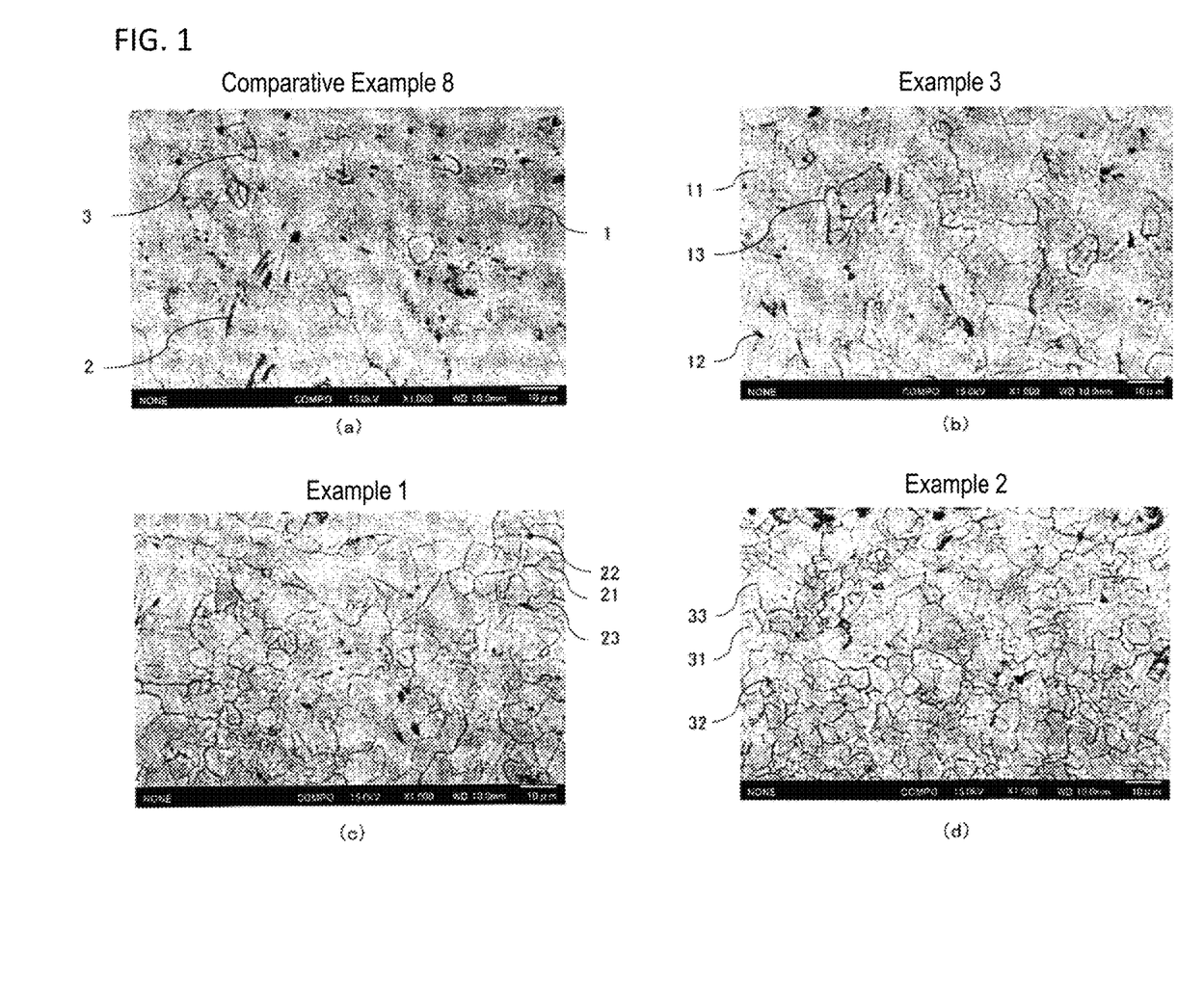
FIG. 1 is SEM photographs of solder alloys: photograph (a) of FIG. 1 is an SEM photograph of the solder alloy of Comparative Example 8; photograph (b) of FIG. 1 is an SEM photographs of the solder alloy of Example 3; photograph (c) of FIG. 1 is an SEM photograph of the solder alloy of Example 1; and photograph (d) of FIG. 1 is an SEM photograph of the solder alloy of Example 2.

The structure of each of Examples 1 to 3 and Comparative Example 8, which are shown in Table 1, was examined FIG. 1 is SEM photographs of the solder alloys: photograph (a) of FIG. 1 is an SEM photograph of the solder alloy of Comparative Example 8; photograph (b) of FIG. 1 is an SEM photographs of the solder alloy of Example 3; photograph

TABLE 1

| Table 1 | | Alloy composition (mass %) | | | | | | | | (1) EM | (2) Wetting property | (3) Shear strength | (4) Rupture M |
|---|---|---|---|---|---|---|---|---|---|---|---|---|---|
| | | Sn | Cu | Ni | Bi | Ge | Co | P | Fe | | | | |
| Comparative Example | 1 | balance | 0.75 | 0.05 | 2 | 0.006 | 0.01 | | | ○ | ○ | ○ | x |
| | 2 | balance | 0.75 | 0.05 | 0.09 | 0.010 | 0.01 | | | x | ○ | ○ | ○ |
| | 3 | balance | 1.10 | 0.05 | 0.1 | 0.010 | 0.01 | | | ○ | x | ○ | ○ |
| | 4 | balance | 0.08 | 0.05 | 1 | 0.010 | 0.01 | | | ○ | ○ | x | ○ |
| | 5 | balance | 0.75 | 0.21 | 0.3 | 0.010 | 0.01 | | | ○ | x | ○ | ○ |
| | 6 | balance | 0.75 | 0.005 | 1 | 0.010 | 0.01 | | | ○ | ○ | x | ○ |
| | 7 | balance | 0.75 | 0.05 | 1 | 0.010 | 0.05 | | | ○ | x | x | ○ |
| | 8 | balance | 0.75 | 0.05 | 1.5 | 0.090 | 0.002 | | | x | ○ | ○ | ○ |
| | 9 | balance | 0.75 | 0.05 | 1 | 0.003 | 0.01 | | | x | ○ | ○ | ○ |
| | 10 | balance | 0.75 | 0.05 | 1 | 0.100 | 0.01 | | | ○ | x | x | x |
| Example | 1 | balance | 0.75 | 0.05 | 1.5 | 0.010 | 0.01 | | | ○ | ○ | ○ | ○ |
| | 2 | balance | 0.75 | 0.05 | 1 | 0.010 | 0.047 | | | ○ | ○ | ○ | ○ |
| | 3 | balance | 0.75 | 0.05 | 1 | 0.010 | 0.003 | | | ○ | ○ | ○ | ○ |
| | 4 | balance | 0.75 | 0.05 | 0.1 | 0.010 | 0.01 | | | ○ | ○ | ○ | ○ |
| | 5 | balance | 0.75 | 0.05 | 0.3 | 0.010 | 0.01 | | | ○ | ○ | ○ | ○ |
| | 6 | balance | 0.75 | 0.05 | 1.9 | 0.010 | 0.01 | | | ○ | ○ | ○ | ○ |
| | 7 | balance | 0.10 | 0.05 | 1 | 0.010 | 0.01 | | | ○ | ○ | ○ | ○ |
| | 8 | balance | 1.00 | 0.05 | 1 | 0.010 | 0.01 | | | ○ | ○ | ○ | ○ |
| | 9 | balance | 0.75 | 0.01 | 1 | 0.010 | 0.01 | | | ○ | ○ | ○ | ○ |
| | 10 | balance | 0.75 | 0.2 | 1 | 0.010 | 0.01 | | | ○ | ○ | ○ | ○ |
| | 11 | balance | 0.75 | 0.05 | 1 | 0.008 | 0.01 | | | ○ | ○ | ○ | ○ |
| | 12 | balance | 0.75 | 0.05 | 1.5 | 0.007 | 0.01 | | | ○ | ○ | ○ | ○ |
| | 13 | balance | 0.75 | 0.05 | 1 | 0.090 | 0.01 | | | ○ | ○ | ○ | ○ |
| | 14 | balance | 0.75 | 0.05 | 1 | 0.008 | 0.01 | 0.008 | | ○ | ○ | ○ | ○ |
| | 15 | balance | 0.75 | 0.05 | 1 | 0.008 | 0.01 | | 0.008 | ○ | ○ | ○ | ○ |
| | 16 | balance | 0.75 | 0.05 | 1 | 0.010 | 0.01 | 0.008 | 0.008 | ○ | ○ | ○ | ○ |
| | 17 | balance | 0.75 | 0.05 | 1 | 0.007 | 0.01 | | | ○ | ○ | ○ | ○ |
| | 18 | balance | 0.75 | 0.05 | 1.5 | 0.09 | 0.01 | | | ○ | ○ | ○ | ○ |
| | 19 | balance | 0.75 | 0.07 | 1.5 | 0.0075 | 0.008 | | | ○ | ○ | ○ | ○ |
| | 20 | balance | 0.75 | 0.07 | 1.2 | 0.0075 | 0.008 | | | ○ | ○ | ○ | ○ |
| | 21 | balance | 0.75 | 0.07 | 1.0 | 0.0075 | 0.008 | | | ○ | ○ | ○ | ○ |

Each underline indicates that the value is outside the range in the present invention.

As shown in Table 1, Examples 1 to 21 gave results in which the solder alloys were inhibited from suffering the occurrence of EM, showed excellent wetting properties, and had a high shear strength, because the alloy compositions each satisfied all the requirements according to the present invention. With respect to rupture M, no rupture at the bonding interface was observed.

In contrast, Comparative Example 1, which had too high Bi content, showed a rupture at a bonding interface, and the rupture M was rated as poor ("x"). Comparative Example 2 was poor in unsusceptibility to EM because the Bi content therein was too low. Comparative Example 3 showed poor wetting properties because the Cu content therein was too high. Comparative Example 4 showed a poor shear strength because the Cu content therein was too low. Comparative Example 5 showed poor wetting properties because the Ni content therein was too high. Comparative Example 6 showed a poor shear strength because the Ni content therein was too low. Comparative Example 7, which had too high Co content, showed poor wetting properties and hence had a poor shear strength. Comparative Example 8 had an alloy structure which had not undergone sufficient grain refinement because the Co content was too low, resulting in poor unsusceptibility to EM. Comparative Example 9 was poor in unsusceptibility to EM because the Ge content therein was too low. Comparative Example 10 showed impaired wetting properties because the Ge content was too high, and hence was poor ("x") in shear strength and rupture M.

(c) of FIG. 1 is an SEM photograph of the solder alloy of Example 1; and photograph (d) of FIG. 1 is an SEM photograph of the solder alloy of Example 2.

In the photograph (a) of FIG. 1, which is a photograph of Comparative Example 8, coarse grains of an Sn phase 1 were present because the Co content was too low, although refined grains of an intermetallic-compound phase 2 were scatteringly observed, which showed that the alloy structure had not undergone grain refinement. In each of the photographs (b), (c) and (d) of FIG. 1, the grains of an intermetallic compound 12, 22, or 32 had been refined and the grains of an Sn phase 11, 21, or 31 had also been refined as apparent from the presence of a large amount of grain boundaries 13, 23, or 33, because the Co content was within the range in the present invention. It was thus found that the whole structure of each of these alloys had undergone sufficient grain refinement. These photographs further showed that the grains of the alloy structure became finer as the content of Co increased.

As described above, an Sn—Bi—Cu—Ni—Ge—Co solder alloy which simultaneously satisfies excellent wetting properties, high shear strength, proper rupture M, and inhibition of the occurrence of EM can be obtained by configuring an alloy composition having Bi, Cu, Ni, and Ge contents regulated to values within the ranges in the present invention and then making this alloy composition have a Co content within the range in the present invention.

TABLE 2

| | | Alloy composition (mass %) | | | | | | | | (1) EM | (2) Wetting property | (3) Shear strength | (4) Rupture M |
|---|---|---|---|---|---|---|---|---|---|---|---|---|---|
| | | Sn | Cu | Ni | Bi | Ge | P | (Bi × Ge)/(Cu × Ni) | Ge/Sn $[10^{-6}]$ | | | | |
| Comparative Example | 11 | balance | 0.75 | 0.05 | 2 | 0.006 | | 0.32 | 62 | ○ | ○ | ○ | x |
| | 12 | balance | 0.75 | 0.05 | 0.09 | 0.010 | | 0.024 | 101 | x | ○ | ○ | ○ |
| | 13 | balance | 1.10 | 0.05 | 0.1 | 0.010 | | 0.018 | 101 | ○ | x | ○ | ○ |
| | 14 | balance | 0.08 | 0.05 | 1 | 0.010 | | 2.5 | 101 | ○ | ○ | x | ○ |
| | 15 | balance | 0.75 | 0.21 | 0.3 | 0.010 | | 0.019 | 101 | ○ | x | ○ | ○ |
| | 16 | balance | 0.75 | 0.005 | 1 | 0.010 | | 2.667 | 102 | ○ | ○ | x | ○ |
| | 17 | balance | 0.75 | 0.05 | 1 | 0.003 | | 0.08 | 31 | x | ○ | ○ | ○ |
| | 18 | balance | 0.75 | 0.05 | 1 | 0.100 | | 2.667 | 1019 | ○ | x | x | x |
| | 19 | balance | 0.75 | 0.05 | 1 | 0.007 | | 0.187 | 71 | x | ○ | ○ | ○ |
| | 20 | balance | 0.75 | 0.05 | 1.5 | 0.090 | | 3.6 | 922 | ○ | x | ○ | ○ |
| Example | 22 | balance | 0.75 | 0.05 | 1.5 | 0.010 | | 0.4 | 102 | ○ | ○ | ○ | ○ |
| | 23 | balance | 0.75 | 0.05 | 0.1 | 0.010 | | 0.027 | 101 | ○ | ○ | ○ | ○ |
| | 24 | balance | 0.75 | 0.05 | 0.3 | 0.010 | | 0.08 | 101 | ○ | ○ | ○ | ○ |
| | 25 | balance | 0.75 | 0.05 | 1.9 | 0.010 | | 0.507 | 103 | ○ | ○ | ○ | ○ |
| | 26 | balance | 0.10 | 0.05 | 1 | 0.010 | | 2.0 | 101 | ○ | ○ | ○ | ○ |
| | 27 | balance | 1.00 | 0.05 | 1 | 0.010 | | 0.2 | 102 | ○ | ○ | ○ | ○ |
| | 28 | balance | 0.75 | 0.01 | 1 | 0.010 | | 1.333 | 102 | ○ | ○ | ○ | ○ |
| | 29 | balance | 0.75 | 0.2 | 1 | 0.010 | | 0.067 | 102 | ○ | ○ | ○ | ○ |
| | 30 | balance | 0.75 | 0.05 | 1 | 0.008 | | 0.213 | 81 | ○ | ○ | ○ | ○ |
| | 31 | balance | 0.75 | 0.05 | 1.5 | 0.007 | | 0.28 | 72 | ○ | ○ | ○ | ○ |
| | 32 | balance | 0.75 | 0.05 | 1 | 0.090 | | 2.4 | 917 | ○ | ○ | ○ | ○ |
| | 33 | balance | 0.75 | 0.05 | 1 | 0.008 | 0.008 | 0.213 | 81 | ○ | ○ | ○ | ○ |

Each underline indicates that the value is outside the range in the present invention.

As shown in Table 2, Examples 22 to 33 gave results in which the solder alloys were inhibited from suffering the occurrence of EM, showed excellent wetting properties, and had a high shear strength, because the alloy compositions each satisfied all the requirements according to the present invention. With respect to rupture M, no rupture at the bonding interface was observed.

In contrast, Comparative Example 11, which had too high Bi content, showed a rupture at a bonding interface, and the rupture M was rated as poor ("x"). Although Comparative Example 1 had a Ge/Sn smaller than the lower limit of the relation (1), the solder alloy is thought to have retained unsusceptibility to EM because of the excessive addition of Bi.

Comparative Example 12 was poor in unsusceptibility to EM because the Bi content therein was too low. Comparative Example 13 showed poor wetting properties because the Cu content therein was too high. Comparative Example 14 showed a poor shear strength because the Cu content therein was too low. Comparative Example 15 showed poor wetting properties because the Ni content therein was too high. Comparative Example 16 showed a poor shear strength because the Ni content therein was too low. Comparative Example 17 was poor in unsusceptibility to EM because the Ge content therein was too low and the Ge/Sn was smaller than the lower limit of the relation (1). Comparative Example 18 showed impaired wetting properties because of too high Ge content and hence was poor ("x") in shear strength and rupture M. Comparative Example 19 was poor in unsusceptibility to EM because the Ge/Sn was smaller than the lower limit of the relation (1). Comparative Example 20 showed poor wetting properties because the Ge/Sn and the (Bi×Ge)/(Cu×Ni) exceeded the respective upper limits of the relations (1) and (2).

Figure 2:
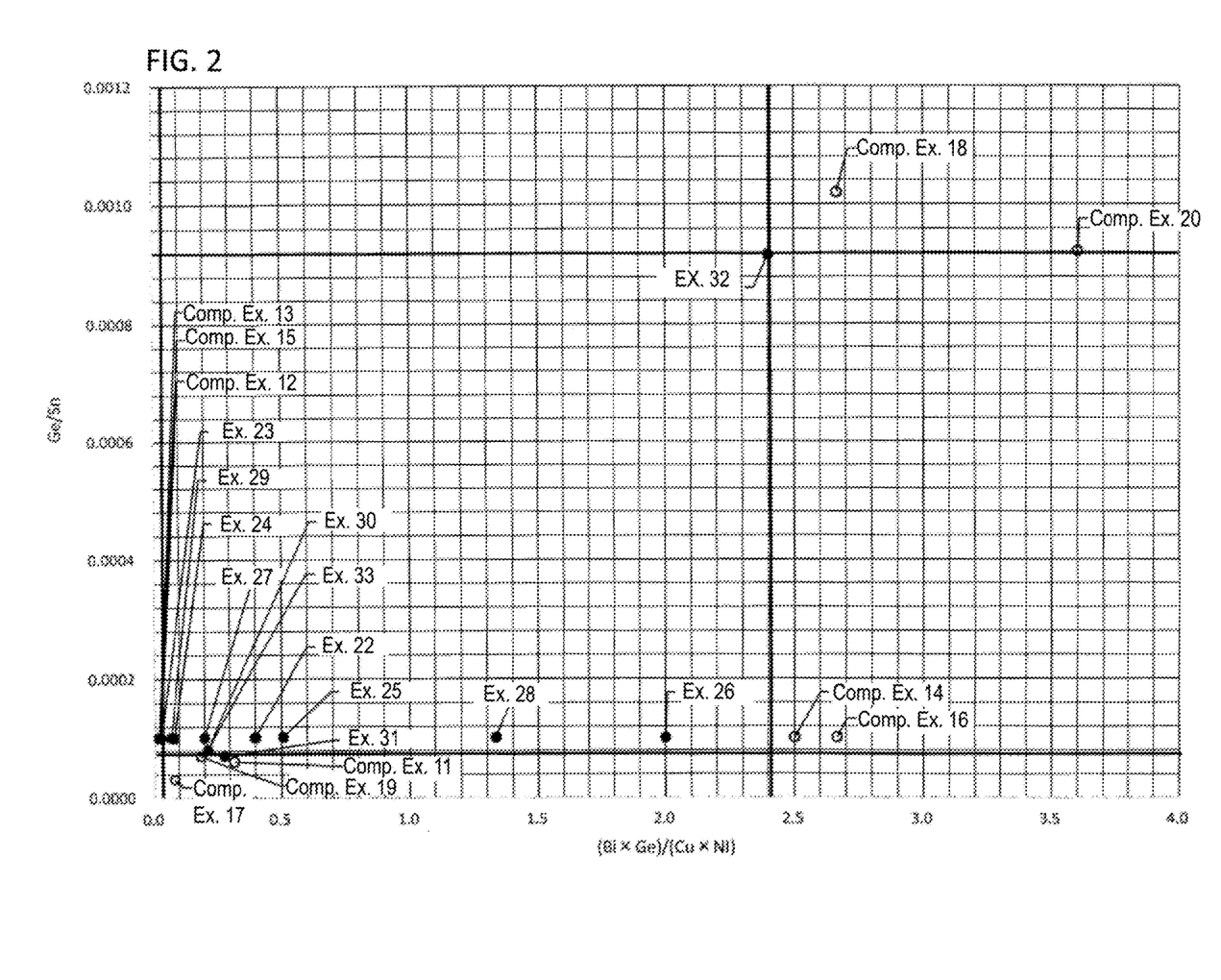
FIG. 2 is a graph showing a relationship between the relation (1) and the relation (2) in Sn—Bi—Cu—Ni—Ge solder alloys.
Figure 3:
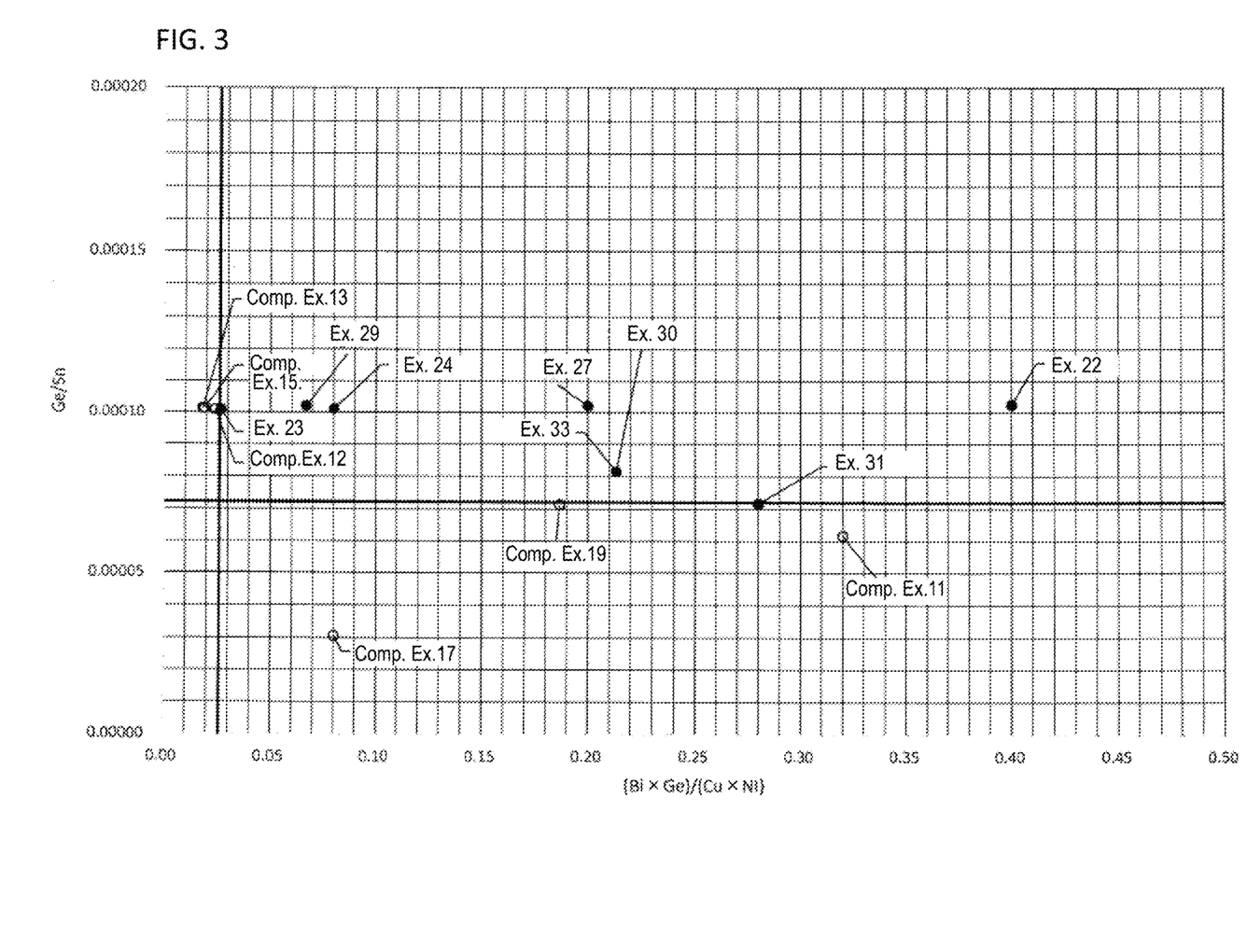
FIG. 3 is an enlarged graph showing the portion of FIG. 2 in which the relation (1) ranges from 0 to 0.500 and the relation (2) ranges from 0 to 0.000200.

The results given in Table 1 are further explained using FIG. 2 and FIG. 3. FIG. 2 is a graph showing a relationship between the relation (1) and the relation (2) in Sn—Bi—Cu—Ni—Ge solder alloys. FIG. 3 is an enlarged graph showing the portion of FIG. 2 in which the relation (1) ranges from 0 to 0.500 and the relation (2) ranges from 0 to 0.000200. In these figures, each "●" indicates an Example, which satisfied all the requirements in the present invention, and each "o" indicates a Comparative Example, which did not satisfy at least one of the requirements of the relations (1) and (2) in the present invention.

As apparent from FIG. 2, it has become apparent that the Examples in the present invention simultaneously satisfied excellent wetting properties, high shear strength, proper rupture M, and inhibition of the occurrence of EM as shown in Table 2, because the Examples each satisfied the relation (1) and the relation (2). Furthermore, as apparent from FIG. 3, comparisons between Example 23 and Comparative Example 12 and between Example 31 and Comparative Example 19 show that Comparative Example 12 and Comparative Example 19 each failed to simultaneously satisfy excellent wetting properties, high shear strength, proper rupture M, and inhibition of the occurrence of EM as shown in Table 2, because the required properties was slightly outside the range of the relation (1) or (2).

It is hence crucially important for an Sn—Bi—Cu—Ni—Ge solder alloy to have an alloy composition in which the contents of the elements are within the proper ranges and which satisfies both the relation (1) and the relation (2), from the standpoint that the solder alloy simultaneously satisfies excellent wetting properties, high shear strength, proper rupture M, and inhibition of the occurrence of EM.

The solder alloy in the present invention is usable not only in CPUs but also in appliances or devices in which a high voltage or a high current is involved, such as power converters for photovoltaic power generation and the high-current inverters of industrial motors.

DESCRIPTION OF THE REFERENCE NUMERALS

1, 11, 21, 31 Sn phase

2, 12, 22, 32 Intermetallic-compound phase

3, 13, 23, 33 Grain boundary

The invention claimed is:

1. A solder alloy consisting of, in mass %:
Bi: 0.1% or more and less than 2.0%;
Cu: 0.1 to 1.0%;
Ni: 0.01 to 0.20%;
Ge: 0.006 to 0.09%;
Co: 0.003% or more and less than 0.05%;
P: 0.1% or less; and
optionally Fe: 0.005 to 0.15%, with the balance being Sn, wherein
the alloy composition satisfies the following relation (1) and relation (2):

$$72\times10^{-6} \leq Ge/Sn \leq 920\times10^{-6} \quad (1)$$

$$0.027 \leq (Bi \times Ge)/(Cu \times Ni) \leq 2.4 \quad (2)$$

where in the relation (1) and the relation (2), Bi, Ge, Cu, Ni and Sn each represents a content (mass %) in the solder alloy.

2. The solder alloy according to claim 1, wherein P is 0 mass %.

3. A solder alloy consisting of, in mass %:
Bi: 0.1% or more and less than 2.0%;
Cu: 0.1 to 1.0%;
Ni: 0.01 to 0.20%;
Ge: 0.006 to 0.09%; and
optionally P: 0.1% or less, with the balance being Sn, wherein
the alloy composition satisfies the following relation (1) and relation (2):

$$72\times10^{-6} \leq Ge/Sn \leq 920\times10^{-6} \quad (1)$$

$$0.027 \leq (Bi \times Ge)/(Cu \times Ni) \leq 2.4 \quad (2)$$

where in the relation (1) and the relation (2), Bi, Ge, Cu, Ni and Sn each represents a content (mass %) in the solder alloy.

4. The solder alloy according to claim 1, wherein Fe is 0% and P is 0.1% or less.

5. The solder alloy according to claim 1, which is for use in an electronic device including a joint through which a current is caused to flow at a current density of 5 kA/cm² to 100 kA/cm².

6. A solder ball consisting of the solder alloy according to claim 1.

7. A solder joint comprising the solder alloy according to claim 1.

8. The solder alloy according to claim 1, wherein Fe is 0.005 to 0.015% in mass.

9. The solder alloy according to claim 3, wherein P is 0.1% or less.

10. The solder alloy according to claim 3, which is for use in an electronic device including a joint through which a current is caused to flow at a current density of 5 kA/cm² to 100 kA/cm².

11. A solder ball consisting of the solder alloy according to claim 3.

12. A solder joint comprising the solder alloy according to claim 3.

13. The solder alloy according to claim 1, wherein Bi is 0.1% or more and less than 1.9% in mass.

14. The solder alloy according to claim 1, wherein Co is 0.003% or more and less than 0.047% in mass.

15. The solder alloy according to claim 3, wherein Bi is 0.1% or more and less than 1.9% in mass.

16. The solder alloy according to claim 1, wherein
Bi is 0.1% or more and less than 1.9% in mass, and
Co is 0.003% or more and less than 0.047% in mass.

* * * * *